United States Patent [19]
Goel

[11] Patent Number: 6,037,641
[45] Date of Patent: Mar. 14, 2000

[54] OPTICAL DEVICE PACKAGE INCLUDING AN ALIGNED LENS

[75] Inventor: Atul Goel, Fort Collins, Colo.

[73] Assignee: Hewlett-Packard Company, Palo Alto, Calif.

[21] Appl. No.: 09/139,692

[22] Filed: Aug. 25, 1998

[51] Int. Cl.[7] .................... H01L 31/0232; H01L 31/0203
[52] U.S. Cl. ........................... 257/432; 257/433; 257/434
[58] Field of Search ..................................... 257/432, 433, 257/431, 434, 436; 385/88, 92, 94

[56] References Cited

U.S. PATENT DOCUMENTS 5,394,490  2/1995  Kato et al. ............................... 257/432

*Primary Examiner*—Minh Loan Tran
*Attorney, Agent, or Firm*—Brian R. Short

[57] ABSTRACT

An optical device package. The optical device package includes a first substrate. The first substrate includes a light sensitive electronic device and several solder bumps. The electronic devices and the solder bumps are oriented on the first substrate according to a predetermined pattern. The optical device package further includes a second substrate. The second substrate includes a lens which is physically attached to the second substrate. The second substrate further includes several conductive pads which receive the plurality of solder bumps and align the light sensitive electronic device with the lens.

4 Claims, 3 Drawing Sheets

OPTICAL DEVICE PACKAGE INCLUDING AN ALIGNED LENS

FIELD OF INVENTION

This invention relates generally to a method of aligning devices of an integrated circuit within packaging of the integrated circuit. In particular, it relates to aligning light sensitive devices of an integrated circuit with light passing through an optical lens associated with the packaging of the integrated circuit.

BACKGROUND

Electronic optical devices, such as cameras, displays, and scanners, generally require an integrated circuit optoelectronic device which includes an integrated circuit which is responsive to optical images. The integrated circuit can include light sensitive devices, such as CCDs or active pixel sensors. The placement of the integrated circuit in the optoelectronic device requires precise alignment between the light sensitive devices of the integrated circuit and a light receiving opening or lens of the optoelectronic device.

FIG. 1 shows an integrated circuit optoelectronic device according to the prior art. Light sensitive devices 2 are formed on a first substrate 4. The light sensitive devices 2 receive light and generate electrical signals proportional to the intensity of the received light. The first substrate 4 is electrically interconnected to a second substrate 6. The second substrate 6 is electrically interconnected to a third substrate 8 (typically a printed circuit board).

The first substrate 4 and the second substrate 6 are electrically interconnected through bonding wires 10. The second substrate 6 and the third substrate 8 are typically electrically interconnected through rigid conductive leads 12. The placement of the light sensitive devices 2 with respect the rigid conductive leads 12 is difficult to control. Therefore, the placement of the light sensitive devices with respect to the third substrate is difficult to control.

The optoelectronic device further includes a lens 14. The lens 14 receives and concentrates light onto the light sensitive devices 2. Clearly, the alignment of the lens 14 with respect to the light sensitive devices 2 effects the operation of the optoelectronic device. Typically, the lens 14 is adjustably referenced with respect to the third substrate 8. That is, the lens 14 can be adjusted in position with respect to the third substrate 8, but when not being adjusted, the position of the lens 14 is fixed.

The optoelectronic device includes a transparent area 16 which allows light passing through the lens 14 to be received by the light sensitive devices 2.

To align the lens 14 with the light sensitive devices 2, the lens 14 is adjusted in position until a maximal response is generated by the light sensitive devices 2. This can be accomplished, for example, by generating a video image from the response of the light sensitive devices 2 and displaying the response on a video monitor. The position of the lens 14 is adjusted until the response displayed by the video monitor is optimal. This approach can be very expensive in a manufacturing environment. The process is time consuming and requires the lens adjustment process.

FIG. 2 shows another integrated circuit optoelectronic device according to the prior art. This device includes an edge surface 20 formed on the second substrate 6. The edge surface 20 provides a reference point between the light sensitive devices 2 and the second substrate 6. The second substrate 6 is interconnected to the third substrate 8 through the rigid conductive leads 12. Therefore, the light sensitive devices 2 are physically referenced to the third substrate 8. The lens 14 is fixed in position with respect to the third substrate 8. Therefore, the light sensitive devices 2 are referenced with respect to the lens 14.

To control the placement of the light sensitive devices 2 with respect to the edge surface 20 requires precise machining and cutting of the edges of the second substrate 4. The machining and precise cutting of the edges is expensive and requires extra processing steps.

Both of the described approaches add extra manufacturing processing steps. Consequently, both approaches are very expensive.

It is desirable to have an optoelectronic device package in which the light sensitive devices of an integrated circuit within the optoelectronic device package is inexpensively aligned with an opening or lens associated with the optoelectronic device package. It is desirable to eliminate the expensive processing steps previously described.

SUMMARY OF THE INVENTION

The present invention includes an optoelectronic device package in which a light sensitive device of an integrated circuit within the optoelectronic device package is inexpensively aligned with an opening or lens associated with the optoelectronic device package.

A first embodiment of this invention includes an optical device package. The optical device package includes a first substrate. The first substrate includes a light sensitive electronic device and several solder bumps. The electronic devices and the solder bumps are oriented on the first substrate according to a predetermined pattern. The optical device package further includes a second substrate. The second substrate includes a lens which is physically attached to the second substrate. The second substrate further includes several conductive pads which receive the plurality of solder bumps and align the light sensitive electronic device with the lens.

A second embodiment is similar to the first embodiment. The second substrate of the second embodiment includes a first surface and a second surface. The lens is attached to the second surface and the plurality of conductive pads reside on the first surface.

A third embodiment is similar to the second embodiment. The third embodiment includes the second substrate including a transparent area which allows light passing through the lens to be received by the light sensitive electronic devices.

A fourth embodiment is similar to the second embodiment. The fourth embodiment includes the second substrate including a cut-out area which allows light passing through the lens to be received by the light sensitive electronic devices.

Other aspects and advantages of the present invention will become apparent from the following detailed description, taken in conjunction with the accompanying drawings, illustrating by way of example the principles of the invention.

DETAILED DESCRIPTION

Figure 1:
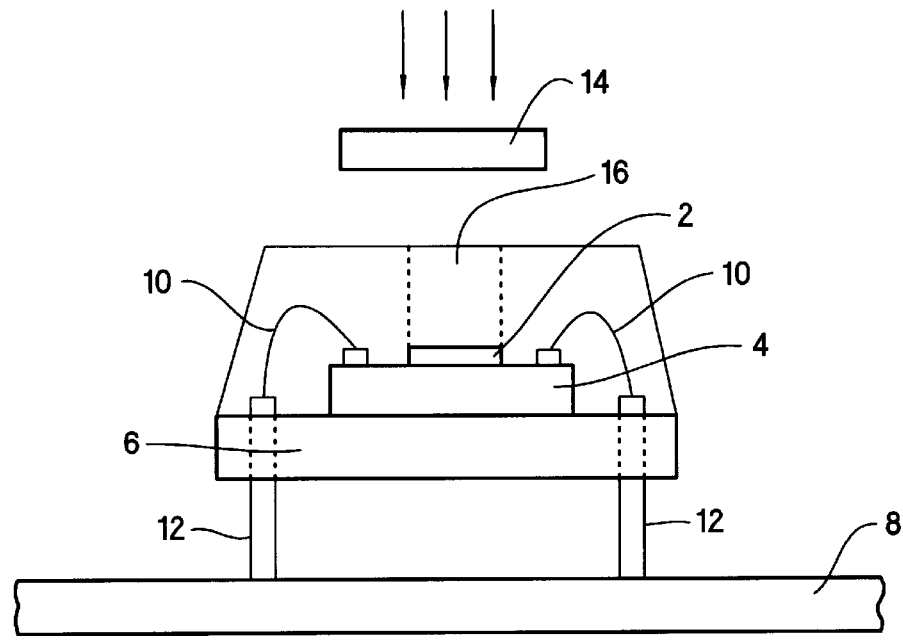
FIG. 1 shows an integrated circuit optoelectronic device according to the prior art.
Figure 2:
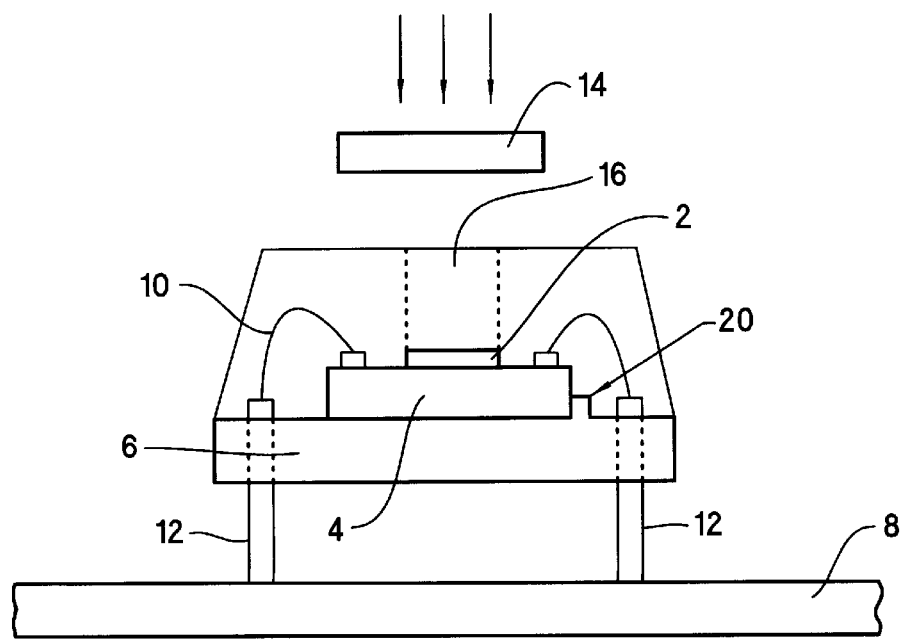
FIG. 2 shows another integrated circuit optoelectronic device according to the prior art.

As shown in the drawings for purposes of illustration, the invention is embodied in an optical device package. The optical device package provides precise alignment between light sensitive devices and an optical lens.

Figure 3:
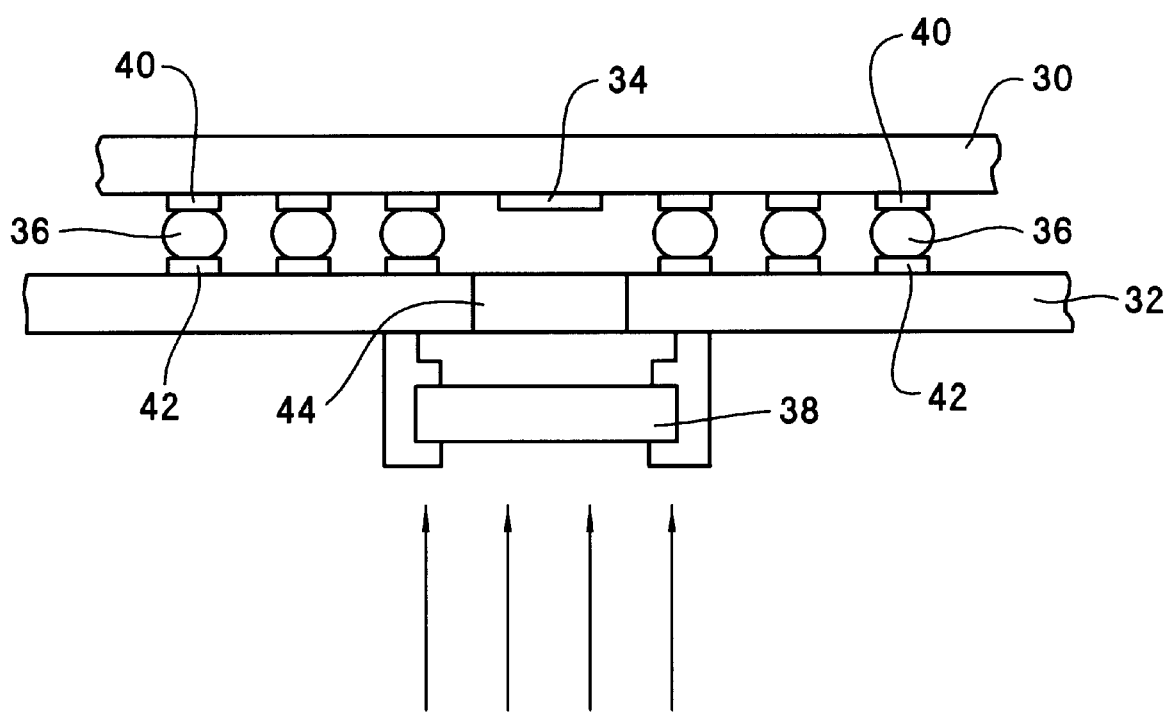
FIG. 3 shows an embodiment of the invention.

FIG. 3 shows an embodiment of the invention. This embodiment includes a first substrate 30 and a second substrate 32. The first substrate 30 includes a light sensitive device 34 which is formed on the first substrate 30. Solder bumps 36 electrically interconnect the first substrate 30 and the second substrate 32. A lens 38 is physically attached to the second substrate 32.

Conductive pads 40 on the first substrate 30 and conductive pads 42 on the second substrate 32 are physically located so that the light sensitive device 34 aligns with the lens 38. The second substrate 32 includes a translucent section 44 which allows light passing though the lens 38 to be received by the light sensitive device 34.

The placement of the conductive pads 40 on the first substrate is controlled by lithographic processes which are used in the formation of the conductive pads 40. Therefore, the placement of the position of the conductive pads 40 with respect to the light sensitive device 34 is only limited by the precision of the lithographic process. Lithographic processes used in the formation of conductive pads and active devices on substrates is well known and understood.

The placement of the conductive pads 42 on the second substrate 32 is controlled by the same lithographic process as previously described. The lens 38 is fixed in position with respect to the second substrate 32.

The solder bumps 36, the placement of the conductive pads 40 and the placement conductive pads 42 determine the position of the first substrate 30 with respect to the second substrate 32.

The absolute position of the light sensitive device with respect to the lens 38 is a function of the placement of the conductive pads 40 of the first substrate 30 with respect to the light sensitive device 34, and the placement of the conductive pads 42 of the second substrate 32 with respect to the lens 38. Placement errors will also result due to inaccuracies of the placement of the first substrate 30 with respect to the second substrate 32 through the solder bumps 36. Each of these placement errors will contribute to the total error included within the accuracy of the placement of the light sensitive device 34 with respect to the lens 38. An estimation of the placement accuracy of the light sensitive device 34 with respect to the lens 38 can be estimated by calculating the root means square (RMS) value of the sum of the estimations of each of the contributing placement errors.

FIG. 3 shows a single configuration of this embodiment. Alternate embodiments could include the light sensitive device 34 being located on the opposite side of the first substrate 30 as depicted in FIG. 3, and the lens 38 being located on the opposite side of the second substrate 32 as depicted in FIG. 3. The essential feature being that the lens 38 aligns with the light sensitive device 34.

Figure 4:
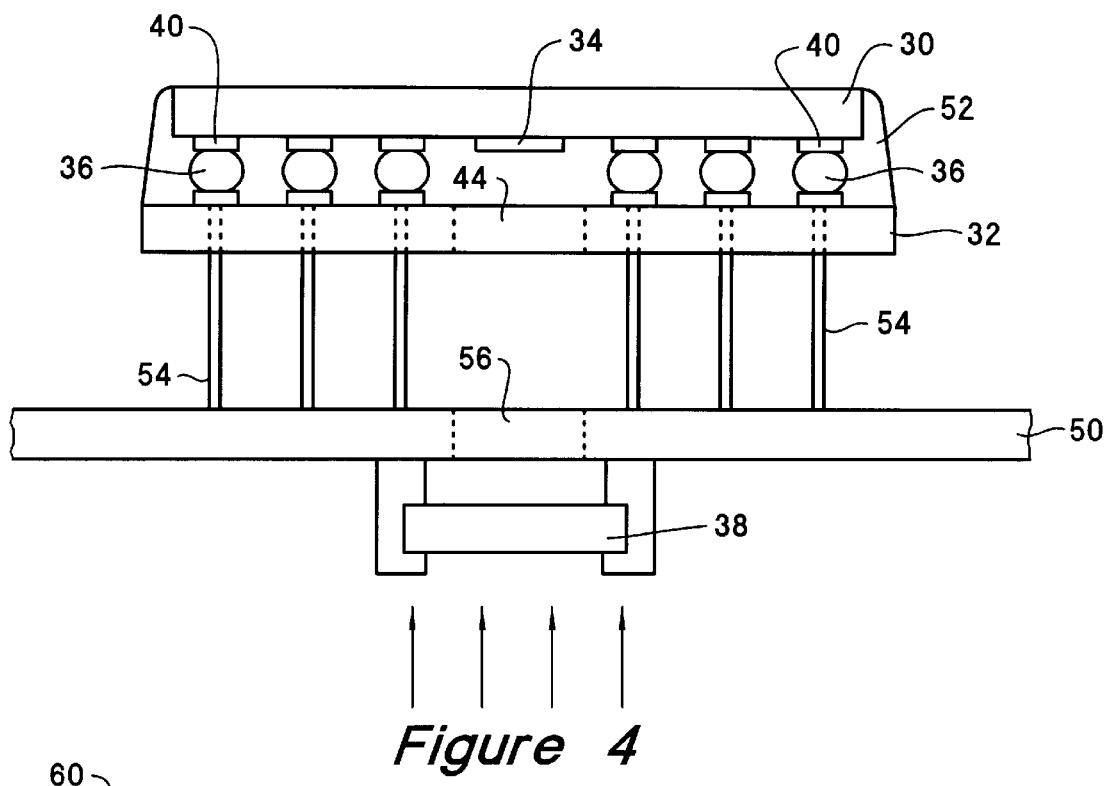
FIG. 4 shows another embodiment of the invention.

FIG. 4 shows another embodiment of the invention. This embodiment further includes a third substrate 50. The lens 38 is physically attached to the third substrate 50. The first substrate 30 and the second substrate 32 are combined to form an optical package 52. The conductive pads 42 of the second substrate 32 are electrically interconnected to the third substrate 50 through rigid conductive leads 54. The third substrate 50 includes a transparent region 56 which allows light passing through the lens 38 to be received by the light sensitive device 34.

The placement accuracy of the light sensitive device 34 with respect to the lens 38 for the embodiment of FIG. 4 can be estimated by following the procedure described for estimating the placement accuracy of the embodiment shown in FIG. 3.

Figure 5:
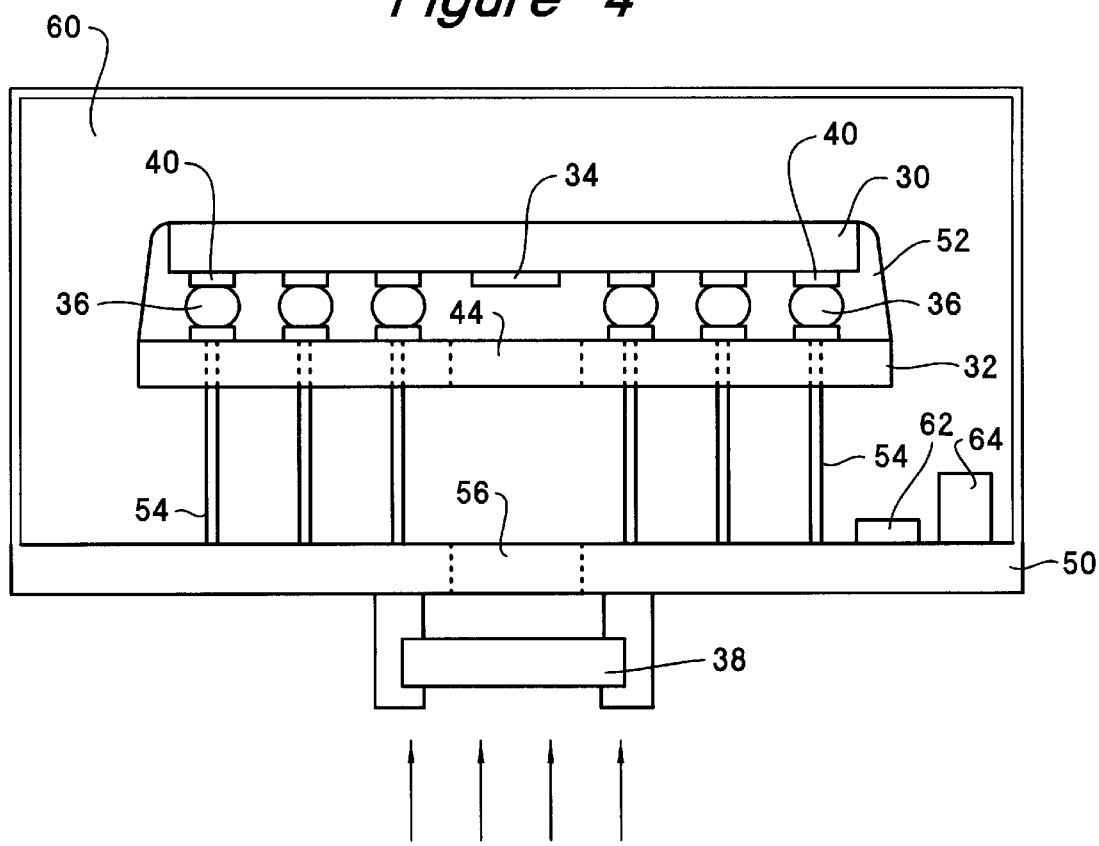
FIG. 5 shows another embodiment of the invention.

FIG. 5 shows another embodiment of the invention. This embodiment includes a camera 60 in which the third substrate forms a front part of the camera 60. Light images pass through the lens 38 and are received by the light sensitive device 34. The camera 60 further includes memory 62 which can be used to store images received by the light sensitive devices. The camera 60 further includes a battery 64. The camera 60 is small, light and portable.

Although specific embodiments of the invention have been described and illustrated, the invention is not to be limited to the specific forms or arrangements of parts so described and illustrated. The invention is limited only by the claims.

What is claimed is:

1. An optical device package comprising:
    a first substrate comprising:
        a light sensitive electronic device;
        a plurality of solder bumps; wherein the light sensitive electronic device and the solder bumps are oriented on the first substrate according to a predetermined pattern;
    a second substrate comprising:
        a first surface and a second surface;
        a transparent section which light can pass through;
        a plurality of conductive pads formed on the first surface which receive the plurality of solder bumps and align the light sensitive electronic device with the transparent section;
        a plurality of conductive leads attached to the conductive pads and extending from the second surface;
    a third substrate comprising:
        a lens which is attached to the third substrate; wherein the third substrate receives the conductive leads and aligns the light sensitive device with the lens.

2. The optical package of claim 1, wherein the third substrate comprises a printed circuit board.

3. An optical device package comprising:
    a first substrate comprising:
        a light sensitive electronic device;
        a plurality of solder bumps; wherein the light sensitive electronic device and the solder bumps are oriented on the first substrate according to a predetermined pattern;
    a second substrate comprising:
        a first surface and a second surface;
        a transparent section which light can pass through;
        a plurality of conductive pads formed on the first surface which receive the plurality of solder bumps and align the light sensitive electronic device with the transparent section;
        a plurality of conductive leads attached to the conductive pads and extending from the second surface;
    a third substrate, the third substrate forming an outside surface of a camera, the camera receiving images which are sensed by the light sensitive device, the third substrate comprising:

a lens which is attached to the third substrate; wherein the third substrate receives the conductive leads and aligns the light sensitive device with the lens.

4. An optical device package comprising:

a first substrate comprising:
- a light sensitive electronic device;
- a plurality of solder bumps; wherein the light sensitive electronic device and the solder bumps are oriented on the first substrate according to a predetermined pattern;

a second substrate comprising:
- a first surface and a second surface;
- a transparent section which light can pass through;
- a plurality of conductive pads formed on the first surface which receive the plurality of solder bumps and alien the light sensitive electronic device with the transparent section;
- a plurality of conductive leads attached to the conductive pads and extending from the second surface;

a third substrate, the third substrate forming an outside surface of a camera, the camera receiving images which are sensed by the light sensitive device, the third substrate comprising:
- a lens which is attached to the third substrate; wherein the third substrate receives the conductive leads and aligns the light sensitive device with the lens; and wherein the camera comprises memory in which images received by the light sensitive device can be stored.

* * * * *